(12) United States Patent
Itoga et al.

(10) Patent No.: US 9,115,855 B2
(45) Date of Patent: Aug. 25, 2015

(54) WHITE LIGHT SOURCE

(71) Applicants: KABUSHIKI KAISHA TOSHIBA, Tokyo (JP); TOSHIBA MATERIALS CO., LTD., Yokohama (JP)

(72) Inventors: Tatsunori Itoga, Kamakura (JP); Masahiko Yamakawa, Yokohama (JP); Yasumasa Ooya, Chigasaki (JP)

(73) Assignees: KABUSHIKI KAISHA TOSHIBA, Tokyo (JP); TOSHIBA MATERIALS CO., LTD., Yokohama-Shi (JP)

( * ) Notice: Subject to any disclaimer, the term of this patent is extended or adjusted under 35 U.S.C. 154(b) by 105 days.

(21) Appl. No.: 14/026,693

(22) Filed: Sep. 13, 2013

(65) Prior Publication Data

US 2014/0009061 A1 Jan. 9, 2014

Related U.S. Application Data

(63) Continuation of application No. PCT/JP2012/001377, filed on Feb. 29, 2012.

(30) Foreign Application Priority Data

Mar. 15, 2011 (JP) ................................. 2011-057246

(51) Int. Cl.
| | |
|---|---|
| *H01J 1/62* | (2006.01) |
| *F21K 99/00* | (2010.01) |
| *C09K 11/77* | (2006.01) |
| *H05B 33/08* | (2006.01) |

(Continued)

(52) U.S. Cl.
CPC . *F21K 9/56* (2013.01); *C09K 11/02* (2013.01); *C09K 11/7734* (2013.01); *H05B 33/0857* (2013.01); *H01L 33/502* (2013.01); *H01L 33/507* (2013.01); *Y02B 20/181* (2013.01)

(58) Field of Classification Search
CPC ................. H01L 2924/00; H01L 2224/48091; H01L 2924/00014; H01L 2224/48247
USPC ................................... 313/503, 506, 486, 487
See application file for complete search history.

(56) References Cited

U.S. PATENT DOCUMENTS

| | | | |
|---|---|---|---|
| 5,998,925 | A | 12/1999 | Shimizu et al. |
| 6,069,440 | A | 5/2000 | Shimizu et al. |

(Continued)

FOREIGN PATENT DOCUMENTS

| | | |
|---|---|---|
| CN | 1636259 | 7/2005 |
| CN | 101151346 | 3/2008 |

(Continued)

OTHER PUBLICATIONS

International Search Report and Written Opinion (in English) of the International Searching Authority mailed Apr. 3, 2012, in corresponding PCT/JP2012/001377 application.

(Continued)

*Primary Examiner* — Vip Patel
(74) *Attorney, Agent, or Firm* — Harness, Dickey & Pierce, PLC

(57) ABSTRACT

A white light source 1 of an embodiment has color temperature of 2600 [K] or more and less than 3200 [K]. The white light source of the embodiment has a ratio of a minimum emission intensity to a maximum emission intensity in a wavelength region of from 450 to 610 [nm] on an emission spectrum of 0.16 or more and less than 0.35.

30 Claims, 8 Drawing Sheets

(51) Int. Cl.
*C09K 11/02* (2006.01)
*H01L 33/50* (2010.01)

(56) References Cited

U.S. PATENT DOCUMENTS

| | | |
|---|---|---|
| 6,608,332 B2 | 8/2003 | Shimizu et al. |
| 6,614,179 B1 | 9/2003 | Shimizu et al. |
| 7,026,756 B2 | 4/2006 | Shimizu et al. |
| 7,071,616 B2 | 7/2006 | Shimizu et al. |
| 7,126,274 B2 | 10/2006 | Shimizu et al. |
| 7,215,074 B2 | 5/2007 | Shimizu et al. |
| 7,329,988 B2 | 2/2008 | Shimizu et al. |
| 7,362,048 B2 | 4/2008 | Shimizu et al. |
| 7,531,960 B2 | 5/2009 | Shimizu et al. |
| 7,682,848 B2 | 3/2010 | Shimizu et al. |
| 7,855,092 B2 | 12/2010 | Shimizu et al. |
| 7,901,959 B2 | 3/2011 | Shimizu et al. |
| 7,915,631 B2 | 3/2011 | Shimizu et al. |
| 7,943,941 B2 | 5/2011 | Shimizu et al. |
| 7,968,866 B2 | 6/2011 | Shimizu et al. |
| 7,969,090 B2 | 6/2011 | Shimizu et al. |
| 8,148,177 B2 | 4/2012 | Shimizu et al. |
| 8,309,375 B2 | 11/2012 | Shimizu et al. |
| 2004/0007961 A1 | 1/2004 | Srivastava et al. |
| 2004/0245532 A1 | 12/2004 | Maeda et al. |
| 2006/0045832 A1 | 3/2006 | Nagatomi et al. |
| 2006/0181192 A1 | 8/2006 | Radkov et al. |
| 2006/0220520 A1 | 10/2006 | Sakane et al. |
| 2007/0035813 A1 | 2/2007 | Roth et al. |
| 2009/0140630 A1 | 6/2009 | Kijima et al. |
| 2010/0001258 A1 | 1/2010 | Shimizu et al. |
| 2010/0019270 A1 | 1/2010 | Shimizu et al. |
| 2010/0063566 A1 | 3/2010 | Uchiumi et al. |
| 2010/0117516 A1 | 5/2010 | Shimizu et al. |
| 2010/0277054 A1 | 11/2010 | Takashima et al. |
| 2011/0062864 A1 | 3/2011 | Shimizu et al. |
| 2011/0297990 A1 | 12/2011 | Shimizu et al. |

FOREIGN PATENT DOCUMENTS

| | | |
|---|---|---|
| CN | 101194375 | 6/2008 |
| CN | 101442097 | 5/2009 |
| EP | 1878778 | 1/2006 |
| EP | 1630220 | 3/2006 |
| EP | 1865564 | 12/2007 |
| EP | 1895599 | 3/2008 |
| EP | 2094064 | 8/2009 |
| JP | 10242513 | 9/1998 |
| JP | 2004501512 | 1/2004 |
| JP | 2006063233 | 3/2006 |
| JP | 2006310817 | 11/2006 |
| JP | 2011014697 | 1/2011 |
| KR | 20070116123 | 12/2007 |
| KR | 20080009198 | 1/2008 |
| KR | 20080027343 | 3/2008 |
| WO | 0189001 | 11/2001 |
| WO | 2006098450 | 9/2006 |
| WO | 2006106883 | 10/2006 |
| WO | 2006135005 | 12/2006 |
| WO | 2008069101 | 6/2008 |
| WO | 2010110457 | 9/2010 |

OTHER PUBLICATIONS

English Translation International Preliminary Report and Written Opinion of the International Searching Authority for PCT/JP2012012/001377.

Extended European Search Report dated Feb. 25, 2015 in corresponding European Patent Application No. 12757512.4.

ical efficacy $V(\lambda)$, in which a sensitivity of eyes of human being with respect to light is referred to as a spectral luminous efficacy. Accordingly, the spectral luminous efficiency and the standard spectral relative luminous efficacy $V(\lambda)$ have the same meaning. By taking the effect of the blue light on the human body into consideration, light within a range of 420 to 490 nm is controlled. It can be considered that a method as above provides an effect of suppressing a secretion of melatonin.

Meanwhile, a human being has a circadian rhythm. Basically, a human being lives under natural light, but, in a contemporary society, there are various life-styles such as long hours of indoor work and lives in which day and night are reversed. If a life with no exposure to natural light is continued for a long period of time, there is a concern that the circadian rhythm is disturbed, which exerts an adverse effect on human body.

DETAILED DESCRIPTION

Figure 1:
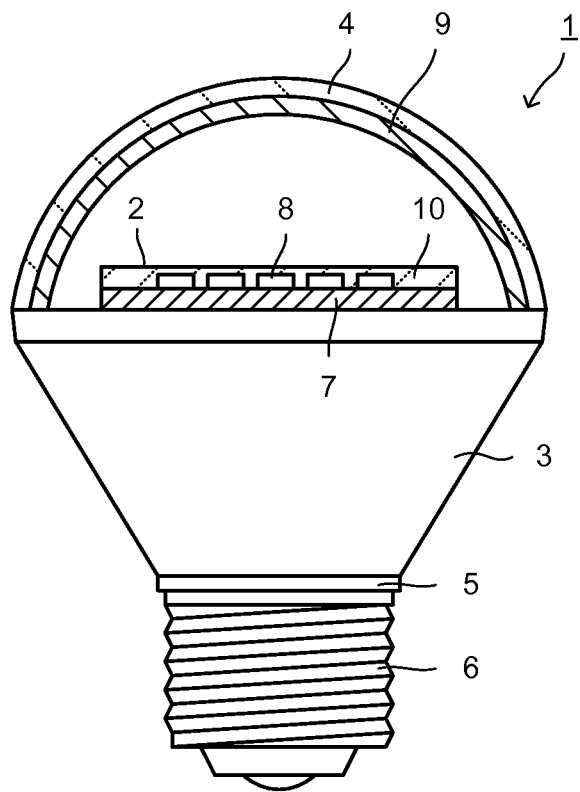
FIG. 1 is a sectional diagram illustrating one example of a white light source of an embodiment.

As described above, regarding the conventional white light source using the LED element, since the emission peak of the blue LED element is strong, the emission spectrum of the white light source is largely different from the emission spectrum of natural light. Although it is possible to consider to suppress the emission peak of the blue LED element, if the emission peak of the blue LED element is suppressed, it is not possible to achieve a predetermined color temperature due to a narrow half value width of the emission peak.

Further, regarding the conventional white light source using the LED element, a portion with low emission intensity is easily formed in a wavelength region between the emission peak of the blue LED element and the emission peak of phosphor. Since a wavelength of the emission peak of the blue LED element and a wavelength of the portion with low emission intensity are close to each other, it is difficult to increase the emission intensity of the portion.

A white light source of a first embodiment is a white light source whose color temperature is 2600 [K] or more and less than 3200 [K]. The white light source of the present embodiment has a ratio of a minimum emission intensity to a maximum emission intensity in a wavelength region of from 450 to 610 [nm] on an emission spectrum of 0.16 or more and less than 0.35.

A white light source of a second embodiment is a white light source whose color temperature is 3200 [K] or more and less than 3900 [K]. The white light source of the present embodiment has a ratio of a minimum emission intensity to a maximum emission intensity in a wavelength region of from 450 to 610 [nm] on an emission spectrum of 0.31 or more and less than 0.55.

A white light source of a third embodiment is a white light source whose color temperature is 3900 [K] or more and less than 4600 [K]. The white light source of the present embodiment has a ratio of a minimum emission intensity to a maximum emission intensity in a wavelength region of from 450 to 610 [nm] on an emission spectrum of 0.51 or more and less than 0.76.

A white light source of a fourth embodiment is a white light source whose color temperature is 4600 [K] or more and less than 5700 [K]. The white light source of the present embodiment has a ratio of a minimum emission intensity to a maximum emission intensity in a wavelength region of from 450 to 610 [nm] on an emission spectrum of 0.72 or more and less than 0.97.

A white light source of a fifth embodiment is a white light source whose color temperature is 5700 [K] or more and 6500 [K] or less. The white light source of the present embodiment has a ratio of a minimum emission intensity to a maximum emission intensity in a wavelength region of from 450 to 610 [nm] on an emission spectrum of 0.79 or more and 0.91 or less.

Hereinafter, white light sources of embodiments will be concretely described.

The white light source of each of the embodiments has the predetermined color temperature, and is characterized by having the ratio of the minimum emission intensity to the maximum emission intensity (minimum emission intensity/maximum emission intensity, which is also described as an emission intensity ratio, hereinafter) in the wavelength region of from 450 to 610 [nm] on the emission spectrum which is in a certain range. According to the white light source of each of the embodiments, since the emission intensity ratio falls within the certain range, and an excessive increase/decrease in the emission intensity is suppressed, the white light source of each of the embodiments has the emission spectrum which is similar to the emission spectrum of natural light. For this reason, compared to the conventional white light source in which the peak of blue light stands out, the white light source of each of the embodiments exerts small adverse effect on the circadian rhythm of human being, and thus is a light source which is friendly to human body by corresponding to the circadian rhythm of human body.

Further, according to the white light sources of the embodiments, since each of the white light sources has the predetermined color temperature, it is possible to reproduce natural light at sunrise, in the morning, in the daytime, and the like. For this reason, by combining these white light sources, it is also possible to reproduce natural light which is the same as sunlight of a day. Accordingly, by using the white light sources of the embodiments in, for example, a hospital ward or a place where long hours of indoor work has to be conducted, it is possible to effectively suppress the adverse effect on the circadian rhythm of human body. Further, since the white light sources of the embodiments can reproduce natural light, they can also be suitably used in an agricultural field and the like.

In the white light source of each of the embodiments, it is preferable that a difference between the emission intensity ratio (minimum emission intensity/maximum emission intensity) in the wavelength region of from 450 to 610 [nm] on the emission spectrum and an emission intensity ratio (minimum emission intensity/maximum emission intensity) in a wavelength region of from 450 to 610 [nm] on an emission spectrum of black body radiation at the same color temperature corresponding to the white light source (also described as a difference in emission intensity ratios, hereinafter) is −0.02 or more and 0.02 or less.

Specifically, when, in the wavelength region of 450 to 610 [nm], the maximum emission intensity and the minimum emission intensity in the emission spectrum of the white light source of each of the embodiments are set to $A_{MAX}$ and $A_{MIN}$, respectively, and the maximum emission intensity and the minimum emission intensity in the emission spectrum of the black body radiation at the same color temperature are set to $B_{MAX}$ and $B_{MIN}$, respectively, the following formula is preferably satisfied.

$$-0.02 \leq (A_{MIN}/A_{MAX}) - (B_{MIN}/B_{MAX}) \leq 0.02$$

The black body radiation is also referred to as a black body emission, and the emission spectrum of the black body radiation is similar to the emission spectrum of natural light (sunlight). The emission spectrum of the black body radiation ($B(\lambda)$) can be determined by the Planck distribution. The Planck distribution can be determined by the following mathematical formula. Here, h is the Planck's constant, c is a velocity of light, $\lambda$ is a wavelength, e is a base of natural logarithm, k is the Boltzmann's constant, and T is a color temperature. Since h, c, e, and k are the constants, when the color temperature T is decided, the emission spectrum of the black body radiation in accordance with the wavelength $\lambda$ can be determined.

$$B(\lambda) = \frac{2hc^2}{\lambda^5} \frac{1}{e^{hc/\lambda kT} - 1} \qquad \text{(Formula 1)}$$

By setting the difference in the emission intensity ratios to be not less than −0.02 nor more than 0.02, the emission spectrum of the white light source of each of the embodiments can be further approximated to the emission spectrum of natural light, and it is possible to realize the light source which can largely suppress the adverse effect on the circadian rhythm of human being and thus is friendly to human body by corresponding to the circadian rhythm of human body, when compared to the conventional white light source in which the peak of blue light stands out.

The white light source of each of the embodiments preferably includes an LED element (light-emitting diode) as a light-emitting source, and phosphors. An emission peak wavelength of the LED element is preferably within a range of 350 to 420 nm. Specifically, the white light source of each of the embodiments preferably employs a method in which light having an emission peak in an ultraviolet to violet region, is converted into visible light by the phosphors. Regarding each of a blue LED element, a green LED element, and a red LED element whose emission peak wavelength is 420 nm or more, since the emission peak height thereof is large, it is difficult to make an emission intensity ratio fall within a predetermined range. Note that the light-emitting source does not always have to be limited to the LED element, and it is also possible to use a semiconductor laser or the like as long as it has an emission peak wavelength within a range of 350 to 420 nm.

As the phosphor, one has an emission peak wavelength within a range of 420 to 700 nm when being excited by the light-emitting source of 350 to 420 nm, is preferable. Further, as the phosphors, it is preferable to use three types or more of phosphors with different peak wavelengths, and it is preferable to use four types or more of phosphors with different peak wavelengths. The peak wavelength of each of the phosphors is preferably deviated by 10 to 100 nm, and further, by 10 to 50 nm. Specifically, when, preferably three types or more of, more preferably, four types or more of phosphors are used and combined in which the peak wavelengths thereof are deviated by 10 to 100 nm, from a blue region to a red region, the color temperature and the emission intensity ratio can be adjusted to fall within the predetermined ranges.

As the phosphors, in particular, three types or more selected from a blue phosphor (peak wavelength of 440 to 460 nm), a blue-green phosphor (peak wavelength of 480 to 520 nm), a green or yellow phosphor (peak wavelength of 510 to 580 nm), and a red phosphor (peak wavelength of 600 to 665 nm), are preferably used, and it is more preferable to use four types of more selected from the above. Note that for the phosphor of each color, it is not necessarily to use only one type, and it is also possible to use two types or more in a combined manner. When the above-described phosphors of respective colors are combined to be used, the color temperature and the emission intensity ratio can be adjusted to fall within the predetermined ranges. The adjustment of the color temperature and the emission intensity ratio can be conducted by, for example, adjusting a compounding ratio and the like of the phosphors of respective colors, other than the combination of the phosphors of respective colors.

As the phosphors of respective colors, the following phosphors are preferable, since they can be efficiently excited by the light-emitting source of 350 to 420 nm.

As the blue phosphor, there are cited a europium-activated alkaline earth chlorophosphate phosphor (peak wavelength: 440 to 455 nm), and a europium-activated barium magnesium aluminate phosphor (peak wavelength: 450 to 460 nm). The europium-activated alkaline earth chlorophosphate phosphor is preferable.

It is preferable that the europium-activated alkaline earth chlorophosphate phosphor as the blue phosphor has a composition represented by the following general formula.

$$(Sr_{1-x-y-z}Ba_xCa_yEu_z)_5(PO_4)_3Cl \qquad \text{General formula:}$$

where, x, y, and z are numbers satisfying $0 \leq x < 0.5$, $0 \leq y < 0.1$, and $0.005 \leq z < 0.1$.

As the blue-green phosphor, there are cited a europium-activated strontium aluminate phosphor (peak wavelength: 480 to 500 nm), and a europium and manganese-activated barium magnesium aluminate phosphor (peak wavelength: 510 to 520 nm). The europium-activated strontium aluminate phosphor is preferable.

It is preferable that the europium-activated strontium aluminate phosphor as the blue-green phosphor has a composition represented by the following general formula.

$$(Sr_xEu_{1-x})Al_{14}O_{25} \qquad \text{General formula:}$$

where, x is a number satisfying $0 < x \leq 4$.

As the green or yellow phosphor, there are cited a europium and manganese-activated alkaline earth aluminate phosphor (peak wavelength: 510 to 520 nm), a europium and manganese-activated alkaline earth silicate phosphor (peak wavelength: 510 to 580 nm), and a europium-activated SiAlON phosphor (peak wavelength: 530 to 545 nm). It is possible to use only one type of the above, or two types or more of the above in a combined manner.

It is preferable that the europium and manganese-activated alkaline earth aluminate phosphor as the green or yellow phosphor has a composition represented by the following general formula.

$$(Ba_{1-x-y-z}Sr_xCa_yEu_z)(Mg_{1-u}Mn_u)Al_{10}O_{17} \qquad \text{General formula:}$$

where, x, y, z, and u are numbers satisfying $0 \leq x < 0.2$, $0 \leq y < 0.1$, $0.005 < z < 0.5$, and $0.1 < u < 0.5$.

It is preferable that the europium and manganese-activated alkaline earth silicate phosphor as the green or yellow phosphor has a composition represented by the following general formula.

$$(Sr_{1-x-y-z-u}Ba_xMg_yEu_zMn_u)_2SiO_4 \qquad \text{General formula:}$$

where, x, y, z, and u are numbers satisfying $0.1 \leq x \leq 0.35$, $0.025 \leq y \leq 0.105$, $0.025 \leq z \leq 0.25$, and $0.0005 \leq u \leq 0.02$.

It is preferable that the europium-activated SiAlON phosphor as the green or yellow phosphor has a composition represented by the following general formula.

$$(Si,Al)_6(O,N)_8:Eu_x \qquad \text{General formula:}$$

where, x is a number satisfying $0 < x < 0.3$.

$$(Sr_{1-x}Eu_x)_\alpha Si_\beta Al_\gamma O_\delta N_\omega \qquad \text{General formula:}$$

where, x, α, β, γ, δ, and ω are numbers satisfying $0 < x < 1$, $0 < \alpha \leq 3$, $12 \leq \beta \leq 14$, $2 \leq \gamma \leq 3.5$, $1 \leq \delta \leq 3$, and $20 \leq \omega \leq 22$.

As the red phosphor, there are cited a europium-activated lanthanum oxysulfide phosphor (peak wavelength: 620 to 630 nm), a europium-activated CASN phosphor (peak wavelength: 615 to 665 nm), and a europium-activated SiAlON phosphor (peak wavelength: 600 to 630 nm). It is possible to use only one type of the above, or two types or more of the above in a combined manner.

It is preferable that the europium-activated lanthanum oxysulfide phosphor as the red phosphor has a composition represented by the following general formula.

$$(La_{1-x-y}Eu_xM_y)_2O_2S \qquad \text{General formula:}$$

where, M is at least one element selected from Sm, Ga, Sb, and Sn, and x and y are numbers satisfying $0.08 \leq x < 0.16$, and $0.000001 \leq y < 0.003$.

It is preferable that the europium-activated CASN phosphor as the red phosphor has a composition represented by the following general formula.

$$(Ca_{1-x-y}Sr_xEu_y)SiAlN_3 \qquad \text{General formula:}$$

where, x and y are numbers satisfying $0 \leq x < 0.4$, and $0 < y < 0.5$.

It is preferable that the europium-activated SiAlON phosphor as the red phosphor has a composition represented by the following general formula.

$$(Sr_{1-x}Eu_x)_\alpha Si_\beta Al_\gamma O_\delta N_\omega \qquad \text{General formula:}$$

where, x, α, β, γ, δ, and ω are numbers satisfying $0 < x < 1$, $0 < \alpha \leq 3$, $5 \leq \beta \leq 9$, $1 \leq \gamma \leq 5$, $0.5 \leq \delta \leq 2$, and $5 \leq \omega \leq 15$.

An average particle diameter of the phosphor is preferably 3 to 50 μm. If the average particle diameter is less than 3 μm, since the particle diameter is too small, a manufacturing process becomes complicated, which becomes a main cause of increasing cost. On the other hand, if the average particle diameter exceeds 50 μm, it becomes difficult to uniformly mix the phosphors.

When the white light source whose color temperature is 2600 [K] or more and less than 3200 [K] is obtained, it is preferable to use phosphors obtained by mixing a blue phosphor of not less than 30 mass % nor more than 60 mass %, a blue-green phosphor of not less than 5 mass % nor more than 20 mass %, a green phosphor of 10 mass % or less, a yellow phosphor of 15 mass % or less, and a red phosphor of not less than 20 mass % nor more than 50 mass %. By setting the mixing ratio as above, the emission intensity ratio in the emission spectrum wavelength region of 450 to 610 [nm] can be set to 0.16 or more and less than 0.35, and further, the difference in the emission intensity ratios in the wavelength region can be set to not less than −0.02 nor more than 0.02.

Note that it is only required that at least either of the green phosphor and the yellow phosphor is mixed, a total mixed amount of the green phosphor and the yellow phosphor is preferably 3 mass % or more, and further, the total mixed amount of the green phosphor and the yellow phosphor is preferably 20 mass % or less.

When the white light source whose color temperature is 3200 [K] or more and less than 3900 [K] is obtained, it is preferable to use phosphors obtained by mixing a blue phosphor of not less than 35 mass % nor more than 65 mass %, a blue-green phosphor of not less than 5 mass % nor more than 25 mass %, a green phosphor of 10 mass % or less, a yellow phosphor of 15 mass % or less, and a red phosphor of not less than 15 mass % nor more than 45 mass %. By setting the mixing ratio as above, the emission intensity ratio in the emission spectrum wavelength region of 450 to 610 [nm] can be set to 0.31 or more and less than 0.55, and further, the difference in the emission intensity ratios in the wavelength region can be set to not less than −0.02 nor more than 0.02. Note that it is only required that at least either of the green phosphor and the yellow phosphor is mixed, a total mixed amount of the green phosphor and the yellow phosphor is preferably 3 mass % or more, and further, the total mixed amount of the green phosphor and the yellow phosphor is preferably 20 mass % or less.

When the white light source whose color temperature is 3900 [K] or more and less than 4600 [K] is obtained, it is preferable to use phosphors obtained by mixing a blue phosphor of not less than 40 mass % nor more than 70 mass %, a blue-green phosphor of not less than 10 mass % nor more than 30 mass %, a green phosphor of 10 mass % or less, a yellow phosphor of 15 mass % or less, and a red phosphor of not less than 10 mass % nor more than 40 mass %. By setting the mixing ratio as above, the emission intensity ratio in the emission spectrum wavelength region of 450 to 610 [nm] can be set to 0.51 or more and less than 0.76, and further, the difference in the emission intensity ratios in the wavelength region can be set to not less than −0.02 nor more than 0.02. Note that it is only required that at least either of the green phosphor and the yellow phosphor is mixed, a total mixed amount of the green phosphor and the yellow phosphor is preferably 3 mass % or more, and further, the total mixed amount of the green phosphor and the yellow phosphor is preferably 20 mass % or less.

When the white light source whose color temperature is 4600 [K] or more and less than 5700 [K] is obtained, it is preferable to use phosphors obtained by mixing a blue phosphor of not less than 45 mass % nor more than 75 mass %, a blue-green phosphor of not less than 10 mass % nor more than 30 mass %, a green phosphor of 10 mass % or less, a yellow phosphor of 15 mass % or less, and a red phosphor of not less than 5 mass % nor more than 30 mass %. By setting the mixing ratio as above, the emission intensity ratio in the emission spectrum wavelength region of 450 to 610 [nm] can be set to 0.72 or more and less than 0.97, and further, the difference in the emission intensity ratios in the wavelength region can be set to not less than −0.02 nor more than 0.02. Note that it is only required that at least either of the green phosphor and the yellow phosphor is mixed, a total mixed amount of the green phosphor and the yellow phosphor is preferably 3 mass % or more, and further, the total mixed amount of the green phosphor and the yellow phosphor is preferably 20 mass % or less.

When the white light source whose color temperature is not less than 5700 [K] nor more than 6500 [K] is obtained, it is preferable to use phosphors obtained by mixing a blue phosphor of not less than 50 mass % nor more than 80 mass %, a blue-green phosphor of not less than 10 mass % nor more than 30 mass %, a green phosphor of 10 mass % or less, a yellow phosphor of 15 mass % or less, and a red phosphor of not less than 5 mass % nor more than 20 mass %. By setting the mixing ratio as above, the emission intensity ratio in the emission spectrum wavelength region of 450 to 610 [nm] can be set to not less than 0.79 nor more than 0.91, and further, the difference in the emission intensity ratios in the wavelength region can be set to not less than −0.02 nor more than 0.02. Note that it is only required that at least either of the green phosphor and the yellow phosphor is mixed, a total mixed amount of the green phosphor and the yellow phosphor is preferably 3 mass % or more, and further, the total mixed amount of the green phosphor and the yellow phosphor is preferably 20 mass % or less.

FIG. 1 is a sectional diagram illustrating one example of the white light source of the embodiment. A white light source 1 illustrated in FIG. 1 is a light bulb-type white light source (LED light bulb). In the drawing, 2 denotes an LED module, 3 denotes a base part, 4 denotes a globe, 5 denotes an insulating member, 6 denotes a base, 7 denotes a substrate, 8 denotes an LED chip (LED element), 9 denotes a phosphor layer, and 10 denotes a transparent resin layer.

The white light source 1 includes the LED module 2, the base part 3 having the LED module 2 disposed thereon, the globe 4 attached onto the base part 3 so as to cover the LED module 2, the base 6 attached to a lower end portion of the base part 3 via the insulating member 5, and a lighting circuit (not illustrated) provided in the inside of the base part 3.

The LED module 2 is provided with ultraviolet to violet light-emitting LED chips 8 mounted on the substrate 7. On the substrate 7, a plurality of the LED chips 8 are surface-mounted. For the ultraviolet to violet light-emitting LED chip 8, a light-emitting diode based on InGaN, GaN, AlGaN, or the like is used. On a surface (and inside, according to need) of the substrate 7, a wiring network (not illustrated) is provided, and electrodes of the LED chips 8 are electrically connected to the wiring network of the substrate 7. A wiring whose illustration is omitted is led out on side surfaces or a bottom surface of the LED module 2, and is electrically connected to the lighting circuit (not illustrated) provided in the inside of the base part 3. The LED chips 8 are lit by a direct-current voltage applied via the lighting circuit.

On an inner surface of the globe 4, there is provided the phosphor layer 9 that absorbs ultraviolet to violet light radiated from the LED chips 8 to emit white light. The phosphor layer 9 is formed by combining three types or more of, preferably, four types or more of the phosphors with different peak wavelengths, as described above. Normally, the phosphor layer 9 is formed of a resin and the phosphors. The phosphor layer 9 may be formed as a single-layered phosphor layer in which all of the phosphors of respective colors are mixed, or it may also be formed as a multilayered phosphor layer in which phosphor layers each containing about one to three types of the phosphors mixed therein, are multilayered.

Note that although the white light source 1 illustrated in FIG. 1 has the structure in which the phosphor layer 9 is provided on the inner surface of the globe 4, a structure in which the phosphors are mixed in an outer surface of the globe 4 or in the inside of the globe 4 may also be employed, or it is also possible to mix the phosphors in the transparent resin layer 10.

Figure 2:
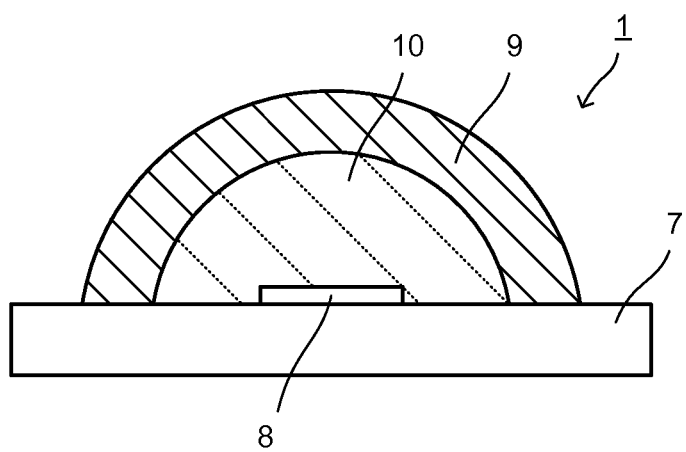
FIG. 2 is a sectional diagram illustrating another example of the white light source of the embodiment.
Figure 3:
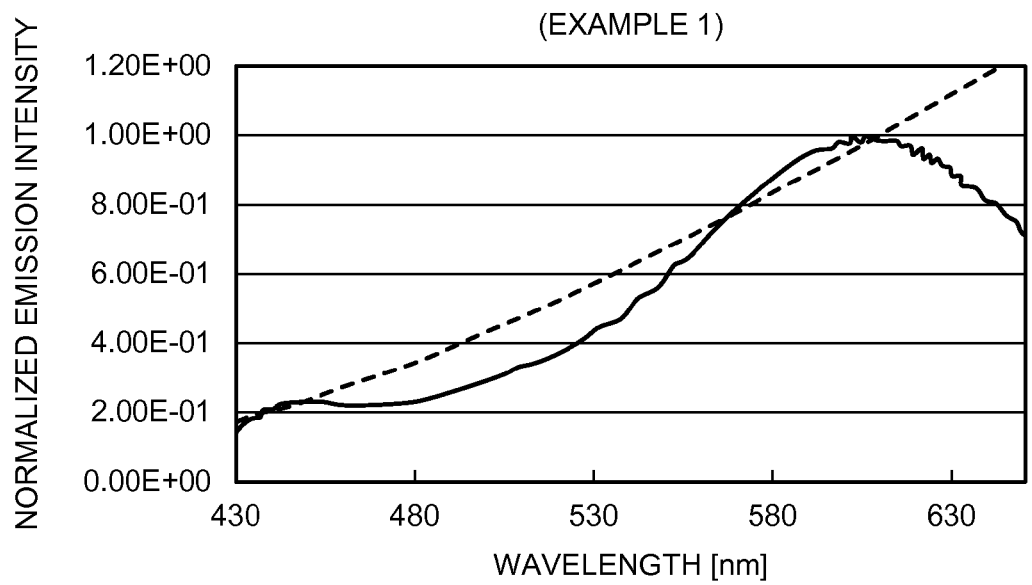
FIG. 3 is a diagram illustrating an emission spectrum of a white light source of an example 1.
Figure 4:
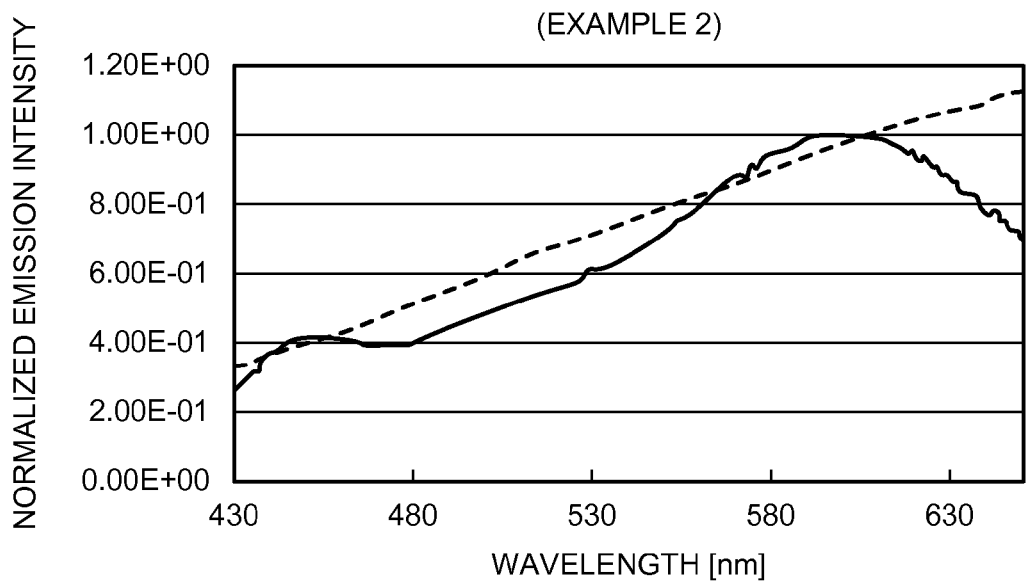
FIG. 4 is a diagram illustrating an emission spectrum of a white light source of an example 2.
Figure 5:
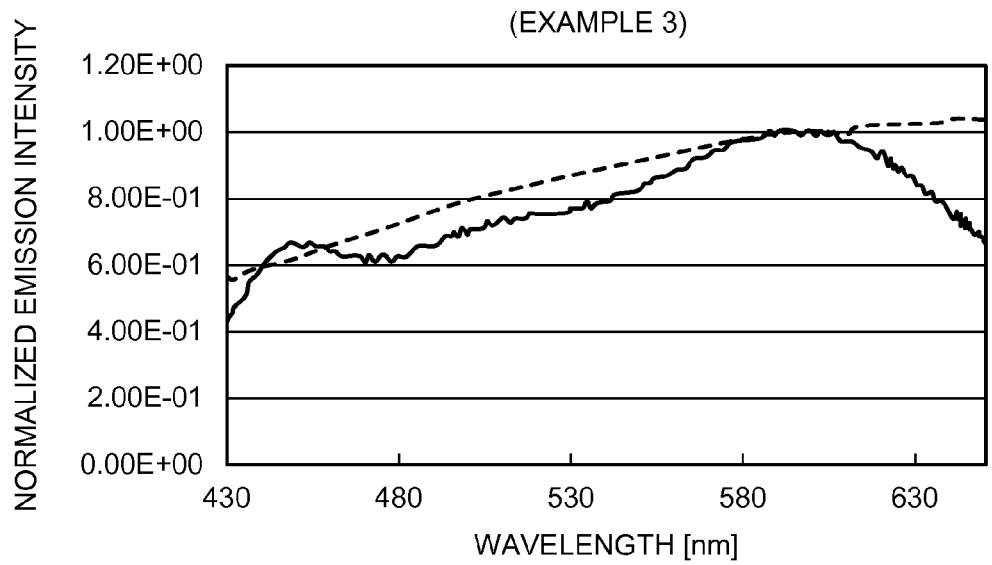
FIG. 5 is a diagram illustrating an emission spectrum of a white light source of an example 3.
Figure 6:
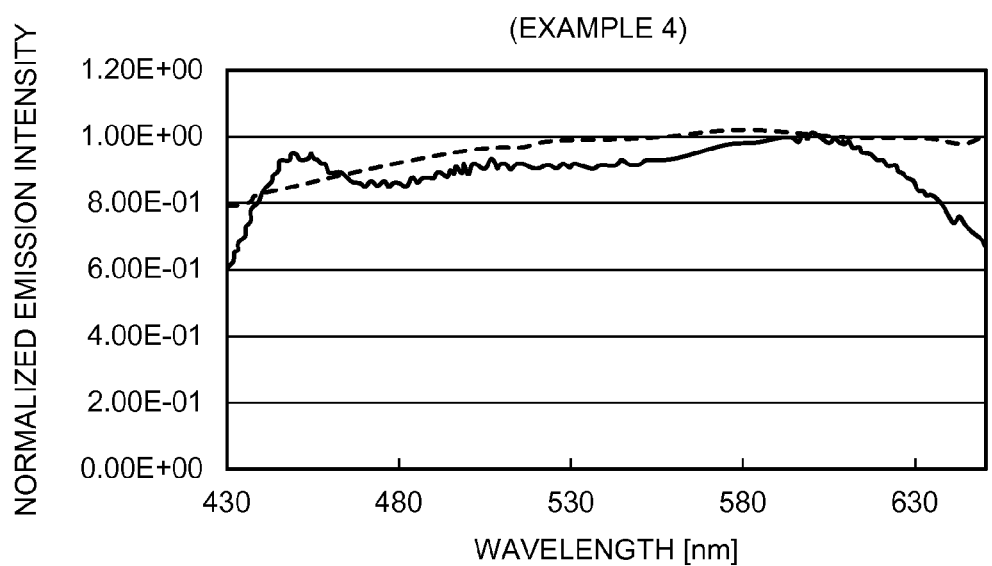
FIG. 6 is a diagram illustrating an emission spectrum of a white light source of an example 4.
Figure 7:
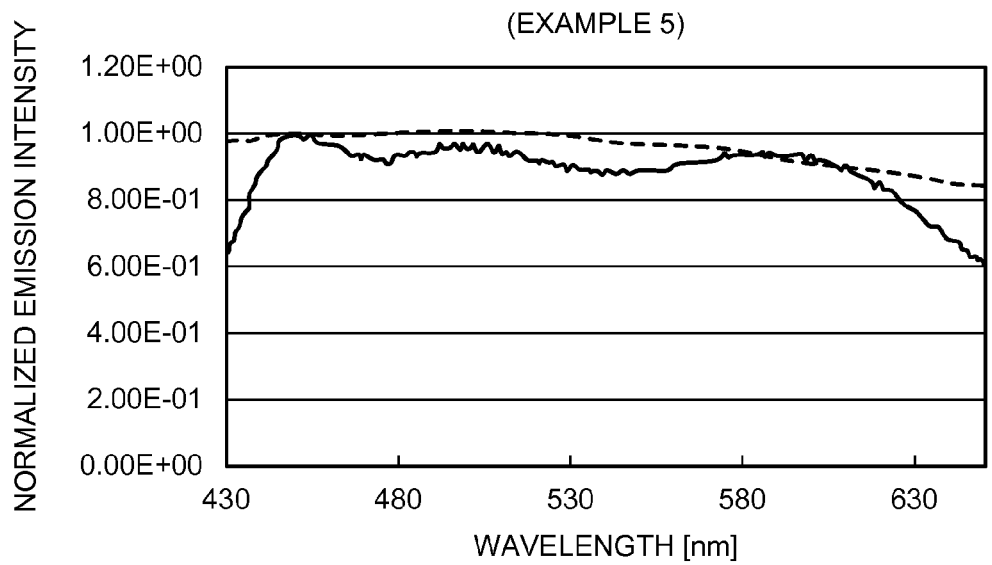
FIG. 7 is a diagram illustrating an emission spectrum of a white light source of an example 5.
Figure 8:
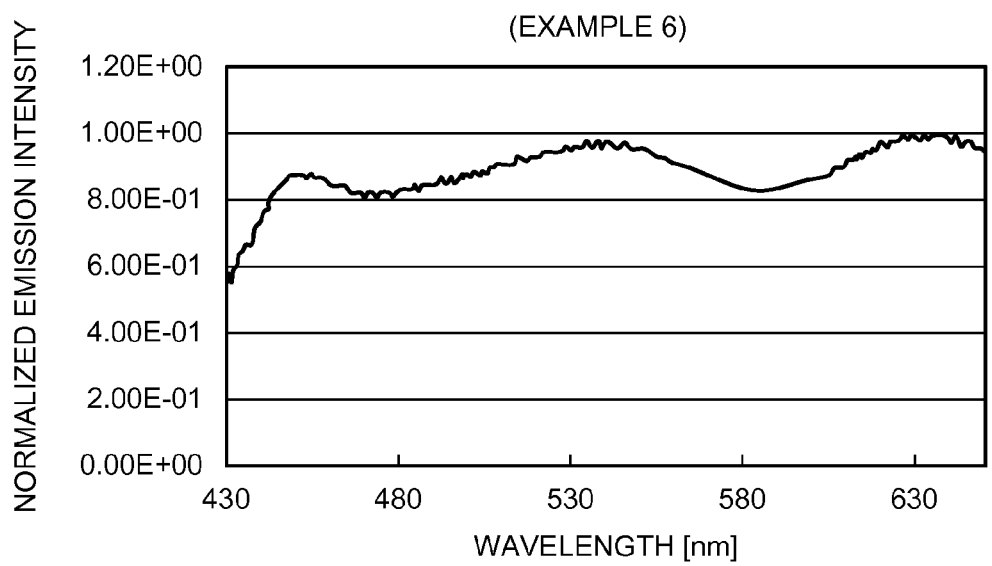
FIG. 8 is a diagram illustrating an emission spectrum of a white light source of an example 6.
Figure 9:
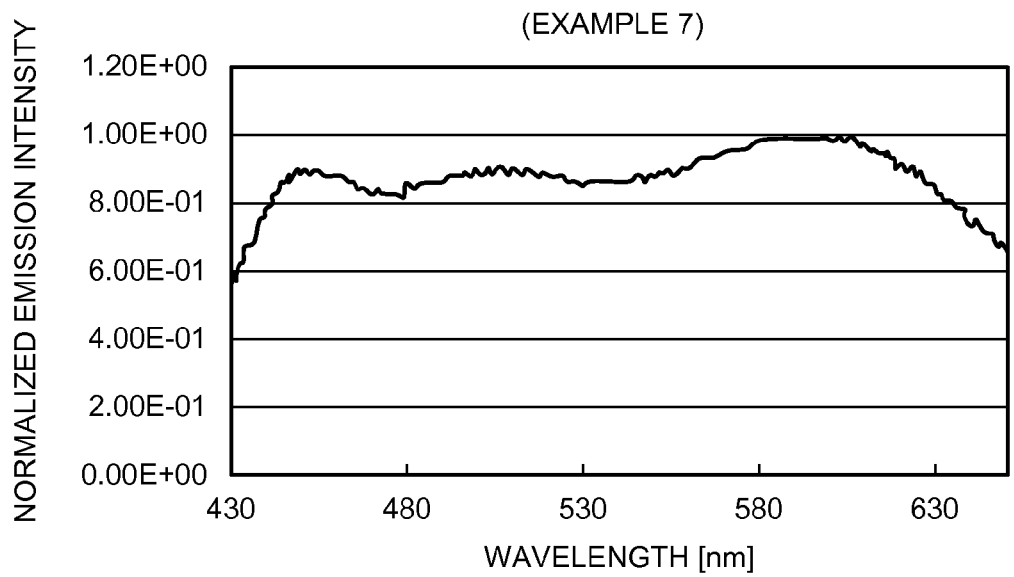
FIG. 9 is a diagram illustrating an emission spectrum of a white light source of an example 7.
Figure 10:
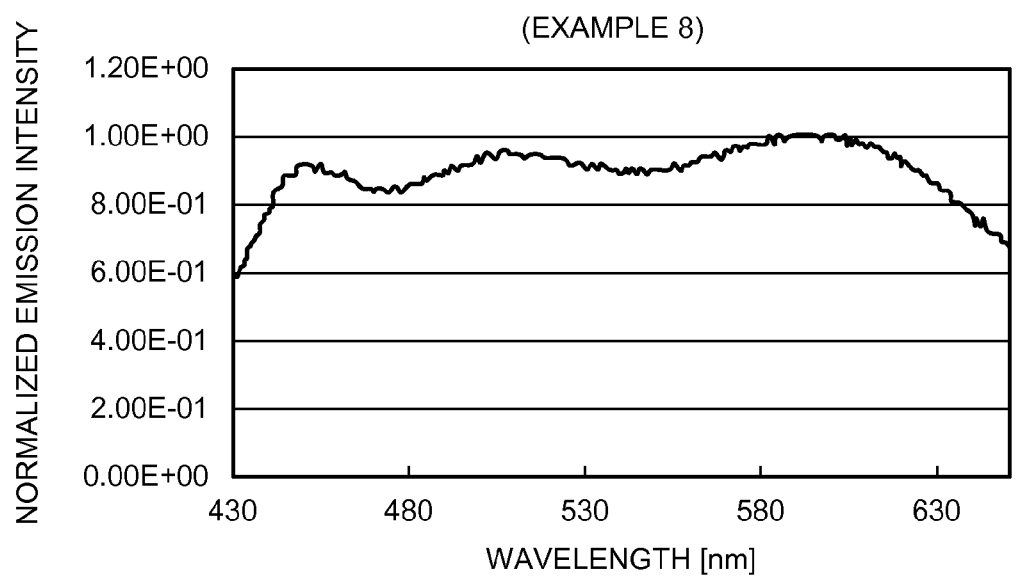
FIG. 10 is a diagram illustrating an emission spectrum of a white light source of an example 8.
Figure 11:
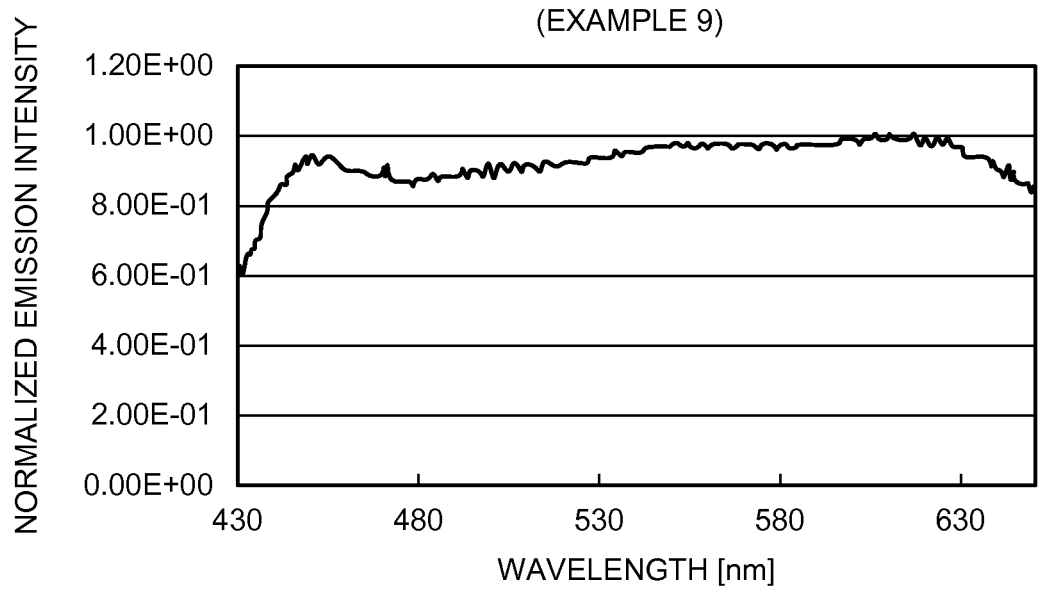
FIG. 11 is a diagram illustrating an emission spectrum of a white light source of an example 9.
Figure 12:
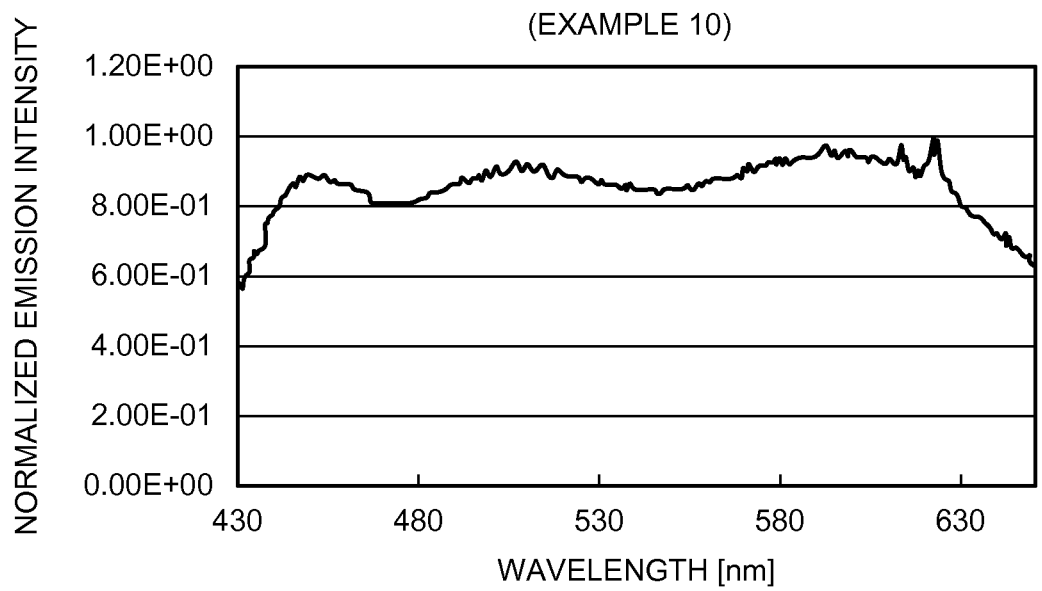
FIG. 12 is a diagram illustrating an emission spectrum of a white light source of an example 10.
Figure 13:
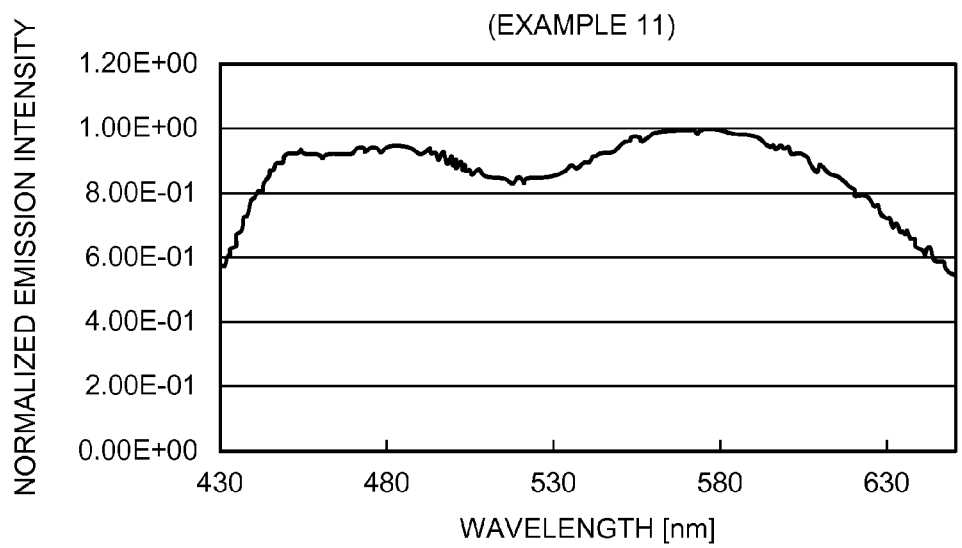
FIG. 13 is a diagram illustrating an emission spectrum of a white light source of an example 11.

FIG. 2 is a sectional diagram illustrating another example of the white light source of the embodiment. A white light source 1 illustrated in FIG. 2 is a one chip-type white light source. In the white light source 1, one LED chip 8 is mounted on a substrate 7, a transparent resin layer 10 is provided in a hemispheric shape so as to directly cover the LED chip 8, and further, a phosphor layer 9 is provided so as to cover the transparent resin layer 10.

The LED chip 8 is an ultraviolet to violet light-emitting LED chip, for example. As the LED chip 8, a light-emitting diode based on InGaN, GaN, AlGaN, or the like is used. On a surface (and inside, according to need) of the substrate 7, a wiring network (not illustrated) is provided, and an electrode of the LED chip 8 is electrically connected to the wiring network of the substrate 7.

The phosphor layer 9 is formed by combining three types or more of, preferably, four types or more of the phosphors with different peak wavelengths, as described above, for example. Normally, the phosphor layer 9 is formed of a resin and the phosphors. The phosphor layer 9 may be formed as a single-layered phosphor layer in which all of the phosphors of respective colors are mixed, or it may also be formed as a multilayered phosphor layer in which phosphor layers each containing about one to three types of the phosphors mixed therein, are multilayered.

The white light sources 1 of the embodiments can be manufactured in a manner similar to that of the conventional white light source, except that the predetermined phosphor layer 9 is provided on the inner surface or the like of the globe 4 as illustrated in FIG. 1, or the predetermined phosphor layer 9 is provided so as to cover the transparent resin layer 10 as illustrated in FIG. 2. The phosphor layer 9 can be formed in the following manner, for example.

First, the predetermined phosphors are dispersed in a binder resin such as a silicone resin, and the resultant is subjected to deaeration, to thereby prepare a phosphor slurry. Thereafter, the phosphor slurry is applied to, for example, the inside of the globe 4 in an amount at which the phosphor layer 9 with a desired film thickness can be formed, and the globe 4 is rotated by changing an angle thereof so that the phosphor slurry is evenly spread out on the inner surface of the globe 4, thereby forming a coating film of the phosphor slurry on the inner surface of the globe 4. Next, by using an infrared heater, a dryer, or the like, heating is performed until the phosphor slurry forming the coating film stops flowing. Thereafter, by using an oven, heat treatment is performed under a condition of about 100° C.×5 hours to completely cure the coating film, thereby forming the phosphor layer 9.

Note that regarding the formation of the phosphor layer 9, it is possible to prepare a phosphor slurry in which all of the phosphors of respective colors are mixed, and the phosphor slurry is used to form only one layer of phosphor layer, or it is also possible to prepare a plurality of phosphor slurries with different types of the phosphors, and two layers or more of phosphor layers are formed by changing the phosphor slurries. Although it is preferable that the phosphor layer 9 contains the predetermined amounts of phosphors of respective colors in accordance with the color temperature, as described above, the type, the content and the like of the phosphors contained in the individual phosphor layers that form the phosphor layer 9 do not always have to be limited.

Hereinafter, the embodiments will be concretely described while referring to examples.

Examples 1 to 11

As each of white light sources, a light bulb-type white light source as illustrated in FIG. 1 was manufactured. As an LED module, 80 pieces of LED chips each exhibiting a blue-violet color with an emission peak wavelength of 403 nm and each having a half value width of emission spectrum of 15 nm were used. These LED chips were surface-mounted on a substrate. The resultant was coated with a silicone resin as a transparent resin. As each of globes, one with a thickness of about 1 mm, made of polycarbonate, and having a dome shape was used, and a phosphor layer was formed on an inner surface of each of the globes.

As phosphors to be contained in the phosphor layer, there were used a europium-activated alkaline earth chlorophosphate phosphor having an emission peak wavelength of 444 nm (blue), a europium-activated strontium aluminate phosphor having an emission peak wavelength of 491 nm (blue-green), a europium and manganese-activated alkaline earth silicate phosphor having an emission peak wavelength of 525 nm (green 1), a europium-activated SiAlON phosphor having an emission peak wavelength of 535 nm (green 2), a europium and manganese-activated alkaline earth aluminate phosphor having an emission peak wavelength of 515 nm (green 3), a europium and manganese-activated alkaline earth silicate phosphor having an emission peak wavelength of 559 nm (yellow), a europium-activated SiAlON phosphor having an emission peak wavelength of 610 nm (red 1), a europium-activated CASN phosphor having an emission peak wavelength of 640 nm (red 2), and a europium-activated lanthanum oxysulfide phosphor having an emission peak wavelength of 623 nm (red 3). Note that regarding the europium-activated SiAlON phosphor, the green light-emitting phosphor of the green 2 has a composition of $(Sr,Eu)_3Si_{13}Al_3O_2N_{21}$, and the red light-emitting phosphor of the red 1 has a composition of $(Sr,Eu)_2Si_7Al_3ON_{13}$.

In each of the phosphor layers of the examples 1 to 5, a first layer was formed of a phosphor layer of the red 1, a second layer was formed of a phosphor layer of the blue-green, the green 1, and the yellow (mixed phosphor layer), and a third layer was formed of a phosphor layer of the blue, when seen from the globe side. In the example 6, a first layer was formed of a phosphor layer of the red 2, a second layer was formed of a phosphor layer of the blue-green, the green 1, and the yellow (mixed phosphor layer), and a third layer was formed of a phosphor layer of the blue, when seen from the globe side. In the example 7, a first layer was formed of a phosphor layer of the red 1, a second layer was formed of a phosphor layer of the blue-green, the green 2, and the yellow (mixed phosphor layer), and a third layer was formed of a phosphor layer of the blue, when seen from the globe side. In the example 8, a first layer was formed of a phosphor layer of the red 1, a second layer was formed of a phosphor layer of the blue-green, the green 3, and the yellow (mixed phosphor layer), and a third layer was formed of a phosphor layer of the blue, when seen from the globe side. In the example 9, a first layer was formed of a phosphor layer of the red 1 and the red 2 (mixed phosphor layer), a second layer was formed of a phosphor layer of the blue-green, the green 1, and the yellow (mixed phosphor layer), and a third layer was formed of a phosphor layer of the blue, when seen from the globe side. In the example 10, a first layer was formed of a phosphor layer of the red 1 and the red 3 (mixed phosphor layer), a second layer was formed of a phosphor layer of the blue-green, the green 1, and the yellow (mixed phosphor layer), and a third layer was formed of a phosphor layer of the blue, when seen from the globe side. In the example 11, a first layer was formed of a phosphor layer of the red 1, a second layer was formed of a phosphor layer of the blue-green and the yellow (mixed phosphor layer), and a third layer was formed of a phosphor layer of the blue, when seen from the globe side. Note that compounding ratios of the phosphors were as represented in Table 1.

Further, each of the phosphor layers was manufactured in the following manner. The phosphors are dispersed in a silicone resin as a binder resin, and the resultant is subjected to deaeration, to thereby prepare a phosphor slurry. The phosphor slurry is applied to the globe in an amount required for forming the phosphor layer with a desired film thickness, and the globe is rotated by changing an angle thereof so that the phosphor slurry is evenly spread out on the inner surface of the globe, thereby forming a coating film of the phosphor slurry on the inner surface of the globe. Next, by using an infrared heater, a dryer, or the like, heating is performed until the phosphor slurry of the coating film stops flowing. Thereafter, by using an oven, heat treatment is performed under a condition of about 100° C.×5 hours to completely cure the coating film, thereby forming the phosphor layer.

Comparative Examples 1 and 2

There were prepared light bulb-type white light sources to which a combination of blue light-emitting LED chip and yellow phosphor (YAG phosphor) was applied. Note that as the blue light-emitting LED chip, one with an emission peak wavelength of 455 nm was used. As the yellow phosphor, one with an emission peak wavelength of 550 nm was used, and the yellow phosphor was contained in the transparent resin layer 10 covering the LED chip 8. Note that an adjustment of color temperature was conducted through a solid content adjustment of the phosphor contained in the transparent resin.

Figure 14:
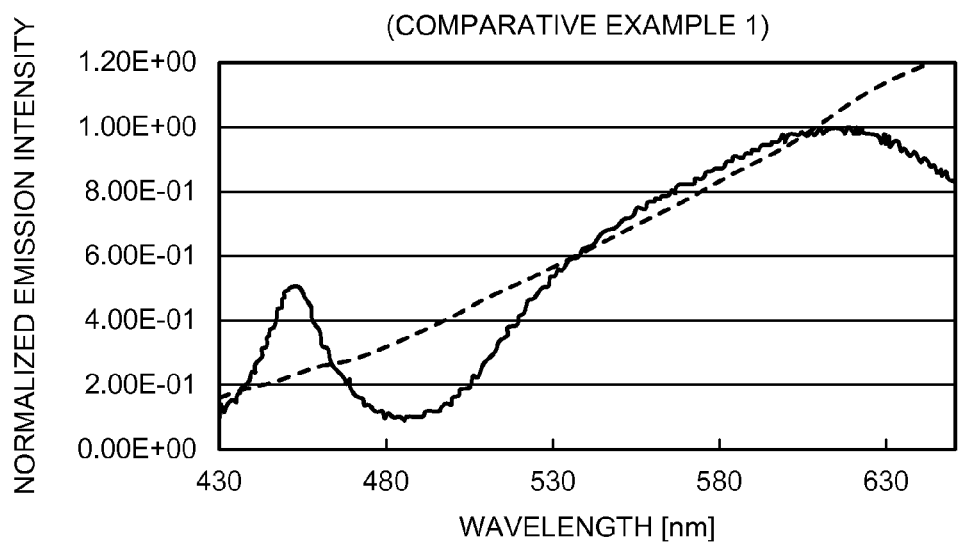
FIG. 14 is a diagram illustrating an emission spectrum of a white light source of a comparative example 1.
Figure 15:
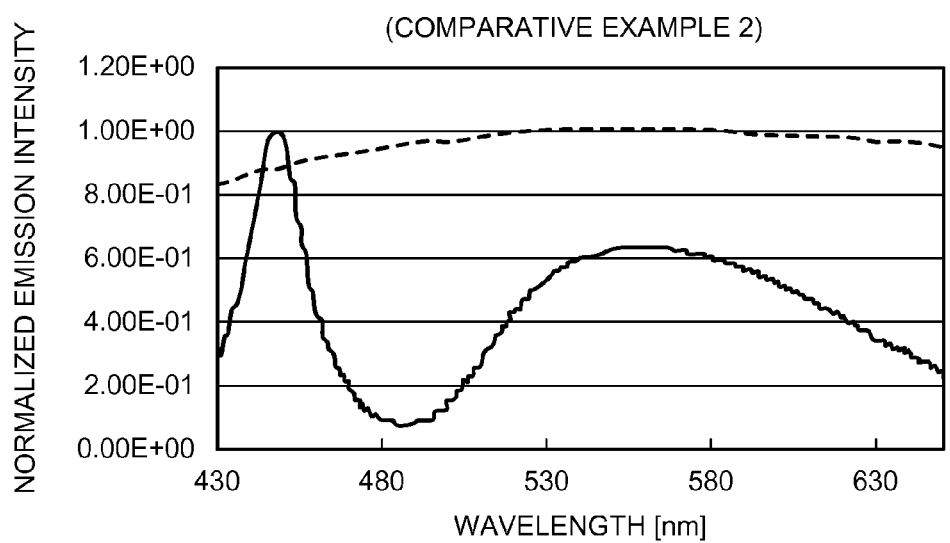
FIG. 15 is a diagram illustrating an emission spectrum of a white light source of a comparative example 2.

Next, an emission spectrum of each of the white light sources of the examples and the comparative examples was measured through a total luminous flux measurement using an integrating sphere based on JIS-C-8152. FIG. 3 to FIG. 13 present the emission spectra of the white light sources of the examples 1 to 11, and FIG. 14 and FIG. 15 present the emission spectra of the white light sources of the comparative examples 1 and 2. Note that in the drawings, a broken line indicates an emission spectrum of black body radiation.

Further, Table 1 presents a luminous flux of each of the white light sources, an emission intensity ratio ($A_{MIN}/A_{MAX}$) of each of the white light sources in a wavelength region of 450 to 610 [nm], and a difference between the emission intensity ratio of each of the white light sources and an emission intensity ratio of the black body radiation (($A_{MIN}/A_{MAX}$)−($B_{MIN}/B_{MAX}$)) in the same wavelength region. Note that Table 2 presents the emission intensity ratio of the black body radiation ($B_{MIN}/B_{MAX}$) in each of color temperatures.

TABLE 1

| | Color Temperature [K] | Phosphor to be used | Mixing Ratio [%] | Luminous Flux [lm] | $A_{MIN}/A_{MAX}$ | $A_{MIN}/A_{MAX}-B_{MIN}/B_{MAX}$ |
|---|---|---|---|---|---|---|
| Example 1 | 2800 | Blue | 50.1 | 326.2 | 0.222 | −0.007 |
| | | Blue-green | 13.8 | | | |
| | | Green 1 | 2.2 | | | |
| | | Yellow | 2.5 | | | |
| | | Red 1 | 31.3 | | | |
| Example 2 | 3400 | Blue | 52.8 | 315.8 | 0.387 | −0.001 |
| | | Blue-green | 15.3 | | | |
| | | Green 1 | 2.1 | | | |
| | | Yellow | 6.3 | | | |
| | | Red 1 | 23.5 | | | |
| Example 3 | 4200 | Blue | 56.6 | 316.8 | 0.614 | −0.005 |
| | | Blue-green | 16.4 | | | |
| | | Green 1 | 2.3 | | | |
| | | Yellow | 6.8 | | | |
| | | Red 1 | 17.9 | | | |
| Example 4 | 5000 | Blue | 60.2 | 325.3 | 0.843 | −0.001 |
| | | Blue-green | 17.3 | | | |
| | | Green 1 | 2.8 | | | |
| | | Yellow | 4.3 | | | |
| | | Red 1 | 15.4 | | | |

TABLE 1-continued

| | Color Temperature [K] | Phosphor to be used | Mixing Ratio [%] | Luminous Flux [lm] | $A_{MIN}/A_{MAX}$ | $A_{MIN}/A_{MAX}-B_{MIN}/B_{MAX}$ |
|---|---|---|---|---|---|---|
| Example 5 | 6000 | Blue | 60.1 | 324.2 | 0.875 | −0.011 |
| | | Blue-green | 18.3 | | | |
| | | Green 1 | 2.0 | | | |
| | | Yellow | 6.6 | | | |
| | | Red 1 | 12.9 | | | |
| Example 6 | 5000 | Blue | 56.4 | 334.5 | 0.832 | −0.012 |
| | | Blue-green | 16.7 | | | |
| | | Green 1 | 1.4 | | | |
| | | Yellow | 13.8 | | | |
| | | Red 2 | 11.8 | | | |
| Example 7 | 5000 | Blue | 58.6 | 322.1 | 0.826 | −0.018 |
| | | Blue-green | 17.8 | | | |
| | | Green 2 | 2.7 | | | |
| | | Yellow | 5.8 | | | |
| | | Red 1 | 15.0 | | | |
| Example 8 | 5000 | Blue | 59.4 | 320.3 | 0.835 | −0.009 |
| | | Blue-green | 17.5 | | | |
| | | Green 3 | 2.8 | | | |
| | | Yellow | 5.2 | | | |
| | | Red 1 | 15.2 | | | |
| Example 9 | 5000 | Blue | 54.6 | 309.6 | 0.859 | 0.015 |
| | | Blue-green | 17.2 | | | |
| | | Green 1 | 1.4 | | | |
| | | Yellow | 11.8 | | | |
| | | Red 1 | 8.2 | | | |
| | | Red 2 | 6.8 | | | |
| Example 10 | 5000 | Blue | 58.4 | 308.3 | 0.833 | −0.011 |
| | | Blue-green | 17.1 | | | |
| | | Green 1 | 2.8 | | | |
| | | Yellow | 4.5 | | | |
| | | Red 1 | 15.1 | | | |
| | | Red 3 | 2.0 | | | |
| Example 11 | 5000 | Blue | 55.1 | 302.4 | 0.827 | −0.017 |
| | | Blue-green | 21.9 | | | |
| | | Yellow | 12.6 | | | |
| | | Red 1 | 10.5 | | | |
| CE1 | 2800 | — | — | — | 0.095 | −0.134 |
| CE2 | 5000 | — | — | — | 0.087 | −0.757 |

CE1 to CE2 = Comparative Example 1 to Comparative Example 2

TABLE 2

| | Color Temperature [K] | $B_{MIN}/B_{MAX}$ |
|---|---|---|
| Black Body Locus | 2800 | 0.229 |
| | 3400 | 0.388 |
| | 4200 | 0.619 |
| | 5000 | 0.844 |
| | 6000 | 0.886 |

The white light source of the example 1 is the white light source having the color temperature of 2600 [K] or more and less than 3200 [K], having the emission intensity ratio in the wavelength region of 450 to 610 [nm] of 0.222 (0.16 or more and less than 0.35), and having the difference in the emission intensity ratios in the wavelength region of −0.007 (not less than −0.02 nor more than 0.02), and accordingly, it can be understood that an excessive increase/decrease in the emission intensity is suppressed, and the white light source has the emission spectrum which is similar to the emission spectrum of natural light.

The white light source of the example 2 is the white light source having the color temperature of 3200 [K] or more and less than 3900 [K], having the emission intensity ratio in the wavelength region of 450 to 610 [nm] of 0.387 (0.31 or more and less than 0.55), and having the difference in the emission intensity ratios in the wavelength region of −0.001 (not less than −0.02 nor more than 0.02), and accordingly, it can be understood that an excessive increase/decrease in the emission intensity is suppressed, and the white light source has the emission spectrum which is similar to the emission spectrum of natural light.

The white light source of the example 3 is the white light source having the color temperature of 3900 [K] or more and less than 4600 [K], having the emission intensity ratio in the wavelength region of 450 to 610 [nm] of 0.614 (0.51 or more and less than 0.76), and having the difference in the emission intensity ratios in the wavelength region of −0.005 (not less than −0.02 nor more than 0.02), and accordingly, it can be understood that an excessive increase/decrease in the emission intensity is suppressed, and the white light source has the emission spectrum which is similar to the emission spectrum of natural light.

The white light source of the example 4 is the white light source having the color temperature of 4600 [K] or more and less than 5700 [K], having the emission intensity ratio in the wavelength region of 450 to 610 [nm] of 0.843 (0.72 or more and less than 0.97), and having the difference in the emission intensity ratios in the wavelength region of −0.001 (not less than −0.02 nor more than 0.02), and accordingly, it can be understood that an excessive increase/decrease in the emission intensity is suppressed, and the white light source has the emission spectrum which is similar to the emission spectrum of natural light.

The white light source of the example 5 is the white light source having the color temperature of not less than 5700 [K] nor more than 6500 [K], having the emission intensity ratio in the wavelength region of 450 to 610 [nm] of 0.875 (not less than 0.79 nor more than 0.91), and having the difference in the emission intensity ratios in the wavelength region of −0.011 (not less than −0.02 nor more than 0.02), and accordingly, it can be understood that an excessive increase/decrease in the emission intensity is suppressed, and the white light source has the emission spectrum which is similar to the emission spectrum of natural light.

Each of the white light sources of the examples 7 to 11 is the white light source having the color temperature of 4600 [K] or more and less than 5700 [K], having the emission intensity ratio in the wavelength region of 450 to 610 [nm] of 0.72 or more and less than 0.97, and having the difference in the emission intensity ratios in the wavelength region of not less than −0.02 nor more than 0.02, and accordingly, it can be understood that an excessive increase/decrease in the emission intensity is suppressed, and each of the white light sources has the emission spectrum which is similar to the emission spectrum of natural light.

On the other hand, the white light source of the comparative example 1 in which the blue light-emitting LED chip and the yellow phosphor are combined, is the white light source having the color temperature of 2600 [K] or more and less than 3200 [K], having the emission intensity ratio in the wavelength region of 450 to 610 [nm] of 0.095 (out of the range of 0.16 or more and less than 0.35), and having the difference in the emission intensity ratios in the wavelength region of −0.134 (out of the range of not less than −0.02 nor more than 0.02), and accordingly, it can be understood that the white light source has the emission spectrum which is largely deviated from the emission spectrum of natural light.

The white light source of the comparative example 2 having a combination similar to that of the comparative example 1, is the white light source having the color temperature of 4600 [K] or more and less than 5700 [K], having the emission intensity ratio in the wavelength region of 450 to 610 [nm] of 0.087 (out of the range of 0.72 or more and less than 0.97), and having the difference in the emission intensity ratios in the wavelength region of −0.757 (out of the range of not less than −0.02 nor more than 0.02), and accordingly, it can be understood that the white light source has the emission spectrum which is largely deviated from the emission spectrum of natural light.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A white light source, comprising:
   a light-emitting diode; and
   a phosphor layer absorbing a light radiated from the light-emitting diode to emit a white light;
   the phosphor layer including a blue phosphor of from 30 to 60 mass %, a blue-green phosphor of from 5 to 20 mass %, at least one phosphor selected from a green phosphor and a yellow phosphor of from 3 to 20 mass %, and a red phosphor of from 20 to 50 mass %;
   the white light having a color temperature of 2600 [K] or more and less than 3200 [K] and an emission spectrum which has a wavelength region of from 450 to 610 [nm]; and
   a ratio of a minimum emission intensity to a maximum emission intensity in the wavelength region being 0.16 or more and less than 0.35.

2. The white light source according claim 1,
   wherein a difference between the ratio of the minimum emission intensity to the maximum emission intensity in the wavelength region of the emission spectrum and a ratio of a minimum emission intensity to a maximum emission intensity in a wavelength region of from 450 to 610 [nm] on an emission spectrum of black body radiation at the same color temperature as the white light source is −0.02 or more and +0.02 or less.

3. The white light source according to claim 1,
   wherein the phosphor layer has a single-layer structure or a stacked structure.

4. The white light source according to claim 1,
   wherein the blue phosphor is a europium-activated alkaline earth chlorophosphate phosphor,
   wherein the blue-green phosphor is a europium-activated strontium aluminate phosphor,
   wherein the green or yellow phosphor is at least one selected from a europium and manganese-activated alkaline earth aluminate phosphor, a europium and manganese-activated alkaline earth silicate phosphor, and a europium-activated SiAlON phosphor, and
   wherein the red phosphor is at least one selected from a europium-activated lanthanum oxysulfide phosphor, a europium-activated CASN phosphor, and a europium-activated SiAlON phosphor.

5. The white light source according to claim 1,
   wherein the phosphor layer has an average particle diameter of from 3 to 50 μm.

6. The white light source according to claim 1,
   wherein an amount of the blue-green phosphor is 13.8 mass % or more, and a total amount of the green phosphor and the yellow phosphor is 4.7 mass % or less.

7. A white light source, comprising:
a light-emitting diode; and
a phosphor layer absorbing a light radiated from the light-emitting diode to emit a white light;
the phosphor layer including a blue phosphor of from 35 to 65 mass %, a blue-green phosphor of from 5 to 25 mass %, at least one phosphor selected from a green phosphor and a yellow phosphor of from 3 to 20 mass %, and a red phosphor of from 15 to 45 mass %;
the white light having a color temperature of 3200 [K] or more and less than 3900 [K] and an emission spectrum which has a wavelength region of from 450 to 610 [nm]; and
a ratio of a minimum emission intensity to a maximum emission intensity in the wavelength region being 0.31 or more and less than 0.55.

8. The white light source according claim 7,
wherein a difference between the ratio of the minimum emission intensity to the maximum emission intensity in the wavelength region of the emission spectrum and a ratio of a minimum emission intensity to a maximum emission intensity in a wavelength region of from 450 to 610 [nm] on an emission spectrum of black body radiation at the same color temperature as the white light source is −0.02 or more and +0.02 or less.

9. The white light source according to claim 7,
wherein the phosphor layer has a single-layer structure or a stacked structure.

10. The white light source according to claim 7,
wherein the blue phosphor is a europium-activated alkaline earth chlorophosphate phosphor,
wherein the blue-green phosphor is a europium-activated strontium aluminate phosphor,
wherein the green or yellow phosphor is at least one selected from a europium and manganese-activated alkaline earth aluminate phosphor, a europium and manganese-activated alkaline earth silicate phosphor, and a europium-activated SiAlON phosphor, and
wherein the red phosphor is at least one selected from a europium-activated lanthanum oxysulfide phosphor, a europium-activated CASN phosphor, and a europium-activated SiAlON phosphor.

11. The white light source according to claim 7,
wherein the phosphor layer has an average particle diameter of from 3 to 50 μm.

12. The white light source according to claim 7,
wherein an amount of the blue-green phosphor is 15.3 mass % or more, and a total amount of the green phosphor and the yellow phosphor is 8.4 mass % or less.

13. A white light source, comprising:
a light-emitting diode; and
a phosphor layer absorbing a light radiated from the light-emitting diode to emit a white light;
the phosphor layer including a blue phosphor of from 40 to 70 mass %, a blue-green phosphor of from 10 to 30 mass %, at least one phosphor selected from a green phosphor and a yellow phosphor of from 3 to 20 mass %, and a red phosphor of from 10 to 40 mass %;
the white light having a color temperature of 3900 [K] or more and less than 4600 [K] and an emission spectrum which has a wavelength region of from 450 to 610 [nm]; and
a ratio of a minimum emission intensity to a maximum emission intensity in the wavelength region being 0.51 or more and less than 0.76.

14. The white light source according claim 13,
wherein a difference between the ratio of the minimum emission intensity to the maximum emission intensity in the wavelength region of the emission spectrum and a ratio of a minimum emission intensity to a maximum emission intensity in a wavelength region of from 450 to 610 [nm] on an emission spectrum of black body radiation at the same color temperature as the white light source is −0.02 or more and +0.02 or less.

15. The white light source according to claim 13,
wherein the phosphor layer has a single-layer structure or a stacked structure.

16. The white light source according to claim 13,
wherein the blue phosphor is a europium-activated alkaline earth chlorophosphate phosphor,
wherein the blue-green phosphor is a europium-activated strontium aluminate phosphor,
wherein the green or yellow phosphor is at least one selected from a europium and manganese-activated alkaline earth aluminate phosphor, a europium and manganese-activated alkaline earth silicate phosphor, and a europium-activated SiAlON phosphor, and
wherein the red phosphor is at least one selected from a europium-activated lanthanum oxysulfide phosphor, a europium-activated CASN phosphor, and a europium-activated SiAlON phosphor.

17. The white light source according to claim 13,
wherein the phosphor layer has an average particle diameter of from 3 to 50 μm.

18. The white light source according to claim 13,
wherein an amount of the blue-green phosphor is 16.4 mass % or more, and a total amount of the green phosphor and the yellow phosphor is 9.1 mass % or less.

19. A white light source, comprising:
a light-emitting diode; and
a phosphor layer absorbing a light radiated from the light-emitting diode to emit a white light;
the phosphor layer including a blue phosphor of from 45 to 75 mass %, a blue-green phosphor of from 10 to 30 mass %, at least one phosphor selected from a green phosphor and a yellow phosphor of from 3 to 20 mass %, and a red phosphor of from 5 to 30 mass %;
the white light having a color temperature of 4600 [K] or more and less than 5700[K] and an emission spectrum which has a wavelength region of from 450 to 610 [nm]; and
a ratio of a minimum emission intensity to a maximum emission intensity in the wavelength region being 0.72 or more and less than 0.97.

20. The white light source according claim 19,
wherein a difference between the ratio of the minimum emission intensity to the maximum emission intensity in the wavelength region of the emission spectrum and a ratio of a minimum emission intensity to a maximum emission intensity in a wavelength region of from 450 to 610 [nm] on an emission spectrum of black body radiation at the same color temperature as the white light source is −0.02 or more and +0.02 or less.

21. The white light source according to claim 19,
wherein the phosphor layer has a single-layer structure or a stacked structure.

22. The white light source according to claim 19,
wherein the blue phosphor is a europium-activated alkaline earth chlorophosphate phosphor,
wherein the blue-green phosphor is a europium-activated strontium aluminate phosphor, wherein the green or yellow phosphor is at least one selected from a europium and manganese-activated alkaline earth aluminate phosphor, a europium and manganese-activated alkaline earth silicate phosphor, and a europium-activated SiAlON phosphor, and wherein the red phosphor is at least one selected from a europium-activated lanthanum oxysulfide phosphor, a europium-activated CASN phosphor, and a europium-activated SiAlON phosphor.

23. The white light source according to claim 19, wherein the phosphor layer has an average particle diameter of from 3 to 50 μm.

24. The white light source according to claim 19, wherein an amount of the blue-green phosphor is 16.7 mass % or more, and a total amount of the green phosphor and the yellow phosphor is 15.2 mass % or less.

25. A white light source, comprising:
a light-emitting diode; and
a phosphor layer absorbing a light radiated from the light-emitting diode to emit a white light;
the phosphor layer including a blue phosphor of from 50 to 80 mass %, a blue-green phosphor of from 10 to 30 mass %, at least one phosphor selected from a green phosphor and a yellow phosphor of from 3 to 20 mass %, and a red phosphor of from 5 to 20 mass %;
the white light having a color temperature of 5700 [K] or more and 6500 [K] or less and an emission spectrum which has a wavelength region of from 450 to 610 [nm]; and
a ratio of a minimum emission intensity to a maximum emission intensity in the wavelength region being 0.79 or more and 0.91 or less.

26. The white light source according claim 25, wherein a difference between the ratio of the minimum emission intensity to the maximum emission intensity in the wavelength region of the emission spectrum and a ratio of a minimum emission intensity to a maximum emission intensity in a wavelength region of from 450 to 610 [nm] on an emission spectrum of black body radiation at the same color temperature as the white light source is −0.02 or more and +0.02 or less.

27. The white light source according to claim 25, wherein the phosphor layer has a single-layer structure or a stacked structure.

28. The white light source according to claim 25,
wherein the blue phosphor is a europium-activated alkaline earth chlorophosphate phosphor,
wherein the blue-green phosphor is a europium-activated strontium aluminate phosphor,
wherein the green or yellow phosphor is at least one selected from a europium and manganese-activated alkaline earth aluminate phosphor, a europium and manganese-activated alkaline earth silicate phosphor, and a europium-activated SiAlON phosphor, and
wherein the red phosphor is at least one selected from a europium-activated lanthanum oxysulfide phosphor, a europium-activated CASN phosphor, and a europium-activated SiAlON phosphor.

29. The white light source according to claim 25, wherein the phosphor layer has an average particle diameter of from 3 to 50 μm.

30. The white light source according to claim 25, wherein an amount of the blue-green phosphor is 18.3 mass % or more, and a total amount of the green phosphor and the yellow phosphor is 8.6 mass % or less.

* * * * *